United States Patent
Mallett

(10) Patent No.: US 12,248,043 B2
(45) Date of Patent: Mar. 11, 2025

(54) MAGNETIC RESONANCE GRADIENT SYSTEM

(71) Applicant: Siemens Healthcare GmbH, Erlangen (DE)

(72) Inventor: Michael Mallett, Faringdon (GB)

(73) Assignee: Siemens Healthineers AG, Erlangen (DE)

( * ) Notice: Subject to any disclaimer, the term of this patent is extended or adjusted under 35 U.S.C. 154(b) by 111 days.

(21) Appl. No.: 18/108,153

(22) Filed: Feb. 10, 2023

(65) Prior Publication Data
US 2023/0258751 A1    Aug. 17, 2023

Related U.S. Application Data

(60) Provisional application No. 63/310,754, filed on Feb. 16, 2022.

(51) Int. Cl.
*G01R 33/383* (2006.01)
*G01R 33/3873* (2006.01)

(52) U.S. Cl.
CPC ........ *G01R 33/383* (2013.01); *G01R 33/3873* (2013.01)

(58) Field of Classification Search
CPC .......................... G01R 33/383; G01R 33/3873; G01R 33/385; G01R 33/387
See application file for complete search history.

(56) References Cited

U.S. PATENT DOCUMENTS

| | | | | |
|---|---|---|---|---|
| 4,608,991 A | * | 9/1986 | Rollwitz | G01R 33/34053 600/410 |
| 2008/0024130 A1 | * | 1/2008 | Schlueter | G01R 33/381 324/309 |
| 2010/0237867 A1 | * | 9/2010 | Slade | G01R 33/3873 324/314 |
| 2014/0111202 A1 | * | 4/2014 | Wald | G01R 33/383 324/309 |
| 2014/0375315 A1 | * | 12/2014 | Weinberg | G01R 33/383 324/309 |
| 2024/0012078 A1 | * | 1/2024 | Nevo | G01R 33/383 |

OTHER PUBLICATIONS

Blümler, Permanent Magnet System for MRI with Constant Gradient mechanically adjustable in Direction and Strength, arXiv:1510.02772 [physics.ins-det], 2015, available at https://arxiv.org/pdf/1510.02772 (Year: 2015).*

* cited by examiner

*Primary Examiner* — Daniel R Miller
(74) *Attorney, Agent, or Firm* — Banner & Witcoff Ltd.

(57) ABSTRACT

A gradient system for a magnetic resonance device, configured to, when arranged in use in the magnetic resonance device, generate a variable magnetic gradient field in a scanning region of the magnetic resonance device. The gradient system includes a first magnetic assembly configured to generate a first magnetic gradient field contribution to the magnetic gradient field. The first magnetic assembly includes one or more components configured to, in use, act as respective non-electric magnets to generate the first magnetic gradient field contribution. A positioning unit is configured to adjust a position and/or orientation, relative to the magnetic resonance device, of the first magnetic assembly and/or of one or more of the components of the first magnetic assembly to adjust the first magnetic gradient field contribution and thereby to vary the magnetic gradient field.

19 Claims, 5 Drawing Sheets

MAGNETIC RESONANCE GRADIENT SYSTEM

TECHNICAL FIELD

The present disclosure relates to a gradient system for a magnetic resonance device and a magnetic resonance device comprising a gradient system.

BACKGROUND

A magnetic resonance (MR) device may be used to acquire magnetic resonance data from a scanning region, for example, to allow imaging of an object, such as a part of a human patient, occupying the scanning region.

MR techniques involve generating a magnetic gradient field in the scanning region. The magnetic gradient field is typically superimposed onto a main magnetic field, which may be referred to as the $B_0$ field. The magnetic gradient field is typically aligned with the $B_0$ field along a z direction with a magnitude of the z component of the gradient field varying with position.

The application of the magnetic gradient field results in the strength of the magnetic field in the scanning region varying with position, in a predictable manner. Since the resonance frequency of nuclei in the scanning region is proportional to the magnetic field strength, this variation with position of magnetic field strength provides a known variation in the resonance frequency of the nuclei as a function of position. This allows for magnetic resonance signals to be localized, in order to, for example, generate magnetic resonance images or calculate diffusion coefficients.

Typically, the magnetic gradient field is generated and controlled by rapid switching of electrical currents in a suitably designed set of gradient coils.

SUMMARY

According to a first aspect of the present disclosure, there is provided a gradient system for a magnetic resonance device, the gradient system being configured to, when arranged in use in the magnetic resonance device, generate a variable magnetic gradient field in a scanning region of the magnetic resonance device, the gradient system comprising: a first magnetic assembly configured to generate a first magnetic gradient field contribution to the magnetic gradient field in the scanning region; wherein the first magnetic assembly comprises one or more components configured to, in use, act as respective non-electric magnets to generate the first magnetic gradient field contribution; and a positioning unit configured to adjust a position and/or orientation, relative to the magnetic resonance device, of the first magnetic assembly and/or of one or more of the one or more components of the first magnetic assembly to adjust the first magnetic gradient field contribution and thereby to vary the magnetic gradient field in the scanning region.

The one or more components of the first magnetic assembly may comprise one or more ferromagnetic components configured to be magnetized, in use, by a magnetic field generator of the magnetic resonance device to generate the first magnetic gradient field contribution.

The one or more components of the first magnetic assembly may comprise one or more permanent magnets configured to generate the first magnetic gradient field contribution.

The gradient system may comprise a control unit configured to control the positioning unit to vary the magnetic gradient field in dependence on a sequence protocol for acquiring magnetic resonance data from an object positioned within the scanning region.

The gradient system may comprise: a second magnetic assembly configured to provide a second magnetic gradient field contribution to the magnetic gradient field; wherein the second magnetic assembly comprises one or more components configured to, in use, act as respective non-electric magnets to generate the second magnetic gradient field contribution.

The positioning unit may be configured to adjust the magnetic gradient field by adjusting a position and/or orientation of the second magnetic assembly to adjust the second magnetic gradient field and thereby to vary the magnetic gradient field.

The positioning unit may be configured to adjust a position and/or orientation of the first magnetic assembly and the second magnetic assembly with respect to one another to vary the magnetic gradient field.

The positioning unit may be configured to variably rotate the first magnetic assembly with respect to the scanning region to adjust the first magnetic gradient field contribution and thereby to vary the magnetic gradient field.

The first magnetic assembly may be a first elongate magnetic assembly configured to provide the first magnetic gradient field contribution such that the first magnetic gradient field contribution has a gradient in a plane transverse to a longitudinal axis of the first magnetic assembly.

The first elongate magnetic assembly may be substantially tubular.

The one or more components of the first elongate magnetic assembly may comprise one or more substantially C-shaped components.

The one or more substantially C-shaped components may include two or more substantially C-shaped components which are oriented differently with respect to one another about the longitudinal axis of the first elongate magnetic assembly.

The two or more substantially C-shaped components may comprise a central C-shaped component and two end C-shaped components situated at opposing longitudinal ends of the central C-shaped component.

The two or more substantially C-shaped components may be arranged to form a substantially continuous ring of material about the longitudinal axis of the first elongate magnetic assembly when viewed along the longitudinal axis of the first elongate magnetic assembly.

The second magnetic assembly and the first magnetic assembly may each be elongate; and the positioning unit may be configured to variably rotate the first magnetic assembly and the second magnetic assembly with respect to one another about their respective longitudinal axes to adjust respective orientations of the first magnetic gradient field contribution and the second magnetic gradient field contribution and thereby to vary the magnetic gradient field.

The first magnetic assembly and the second magnetic assembly may each be substantially tubular and may be arranged to be longitudinally coaxial with one another.

The one or more components of the first magnetic assembly may comprise two components and the positioning unit may be configured to variably adjust a position and/or orientation of the two components with respect to one another to adjust the first magnetic gradient field contribution.

The first magnetic assembly may be a substantially disc-shaped assembly and the two components of the first magnetic assembly may each be segments of the substantially disc-shaped assembly. The positioning unit may be configured to adjust a degree of overlap of the two components to adjust the first magnetic gradient field contribution.

The one or more components of the second magnetic assembly may comprise two components and the positioning unit may be configured to variably adjust a position and/or orientation of the two components with respect to one another to adjust the second magnetic gradient field contribution.

The first magnetic assembly and the second magnetic assembly may each be arranged along a longitudinal axis of the gradient system; and the positioning unit may be configured to rotate the one or more components of the first magnetic assembly and the one or more components of the second magnetic assembly about the longitudinal axis to adjust the first magnetic gradient field contribution and the second magnetic gradient field contribution.

The positioning unit may be configured to: rotate, about the longitudinal axis of the gradient system, a first of the two components of the first magnetic assembly and a first of the two components of the second magnetic assembly such that their orientation with respect to one another about the longitudinal axis remains fixed; and rotate, about the longitudinal axis of the gradient system, a second of the two components of the first magnetic assembly and a second of the two components of the second magnetic assembly such that their orientation with respect to one another about the longitudinal axis remains fixed.

According to a second aspect of the present disclosure, there is provided a shimming system for a magnetic resonance device, the shimming system being configured to, when arranged in use in the magnetic resonance device, generate a variable magnetic shimming field in a scanning region of the magnetic resonance device to shim a magnetic field generated by a magnetic field generator of the magnetic resonance device, the shimming system comprising: a first magnetic assembly configured to generate a first magnetic shimming field contribution to the magnetic shimming field in the scanning region; wherein the first magnetic assembly comprises one or more components configured to, in use, act as respective non-electric magnets to generate the first magnetic shimming field contribution; and a positioning unit configured to adjust a position and/or orientation, relative to the magnetic resonance device, of the first magnetic assembly and/or of one or more of the one or more components of the first magnetic assembly to adjust the first magnetic shimming field contribution and thereby to vary the magnetic shimming field in the scanning region.

According to a third aspect of the present disclosure, there is provided a magnetic resonance device for acquiring magnetic resonance data from a scanning region, the magnetic resonance device comprising a gradient system according to the first aspect of the present disclosure or a shimming system according to the second aspect of the present disclosure.

BRIEF DESCRIPTION OF THE DRAWINGS

The present disclosure will now be described, by way of example only, with reference to the following figures, in which.

DETAILED DESCRIPTION

Figure 1:
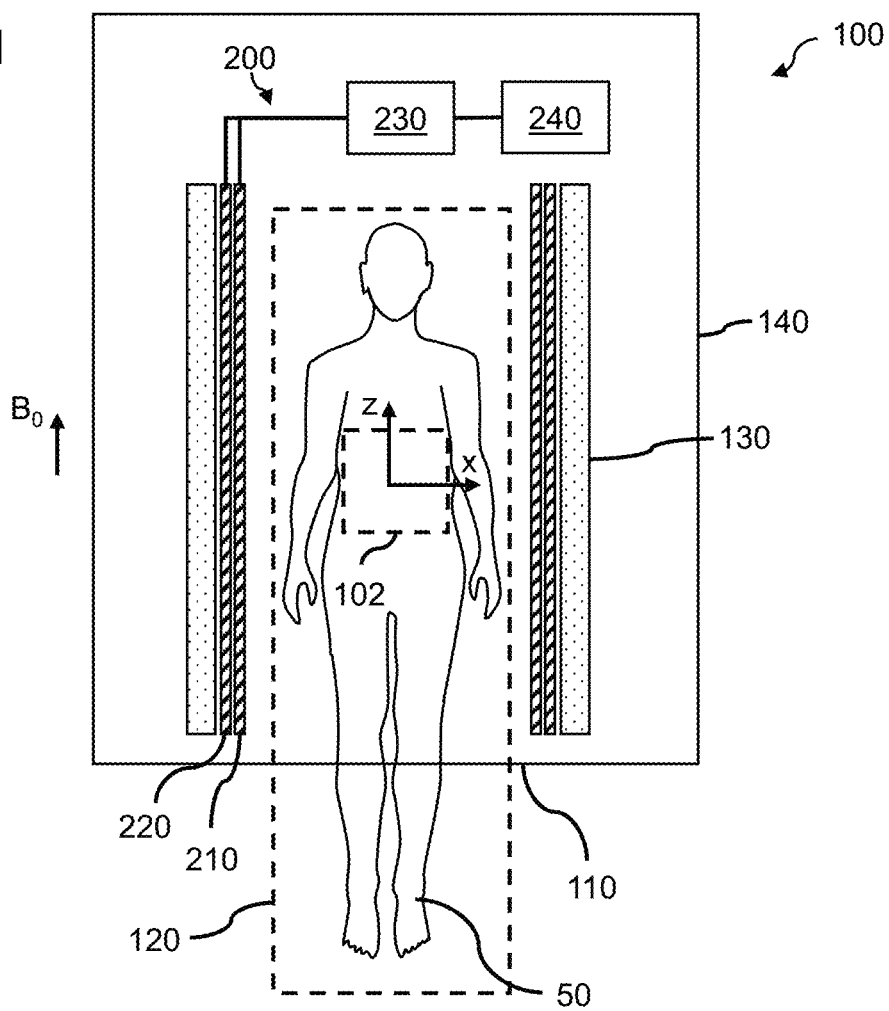
FIG. 1 is a schematic drawing showing a top-down cross-sectional representation of an example magnetic resonance device including an example gradient system.

According to certain examples described herein, a gradient system for a magnetic resonance device is provided. The gradient system may allow for a magnetic gradient field in a scanning region of a magnetic resonance system to be generated by use of one or more magnetic assemblies each comprising components figured to act as non-electric magnets when arranged for use in the magnetic resonance system.

The magnetic gradient field in the scanning region may be varied by use of a positioning unit configured to move the at least one magnetic assembly relative to the magnetic resonance device. Additionally, or alternatively, the positioning unit may vary the magnetic gradient field by movement of one or more components of the magnetic assembly relative to one another.

In some examples, the gradient system includes more than one magnetic assembly, and the magnetic gradient field may be varied by movement of the magnetic assemblies or of one or more components of the magnetic assemblies relative to the scanning region and/or relative to one another. In such examples, the positioning unit may also be configured to move the second magnetic assembly and/or one or more components thereof to adjust the magnetic gradient field.

Each of the one or more assemblies may include one or more ferromagnetic components which are magnetized in use in the magnetic resonance device. Alternatively, or additionally, each magnetic assembly may comprise one or more permanent magnets. Each assembly may, for example, consist of one-piece of permanent magnet or ferromagnetic material or, for example, may consist of multiple smaller pieces. In one example, where a permanent magnet assembly is used, the permanent magnet may be configured as a Halbach-array.

The gradient system may also comprise a control unit configured to control the positioning unit to vary the magnetic gradient field in dependence on a sequence protocol for acquiring magnetic resonance data from an object positioned within the scanning region. For example, a sequence protocol may be an imaging sequence protocol or any protocol for acquiring magnetic resonance data from an object (e.g. an animal, a human patient, an archaeological finding, etc.) positioned within the scanning region of the magnetic resonance device.

As mentioned above, a magnetic gradient field is conventionally generated by rapid switching of electrical currents in a suitably designed set of gradient coils. This requires the gradient coils themselves plus a set of high-current, fast-switching power amplifiers to generate the necessary control currents. Usually, these gradient coils require water cooling and absorb multiple kW of electrical power.

In contrast, according to certain examples described herein, since the gradient system generates the magnetic gradient field by use of non-electric magnets, applying a non-zero gradient strength for extended periods of time may have no thermal penalty as electrical energy is not required to create the field gradients. The need for power amplifiers and cooling apparatus may therefore be reduced. Accordingly, a gradient system may be provided which is simple and which may be efficient in terms of energy usage and space occupied.

Figure 2:
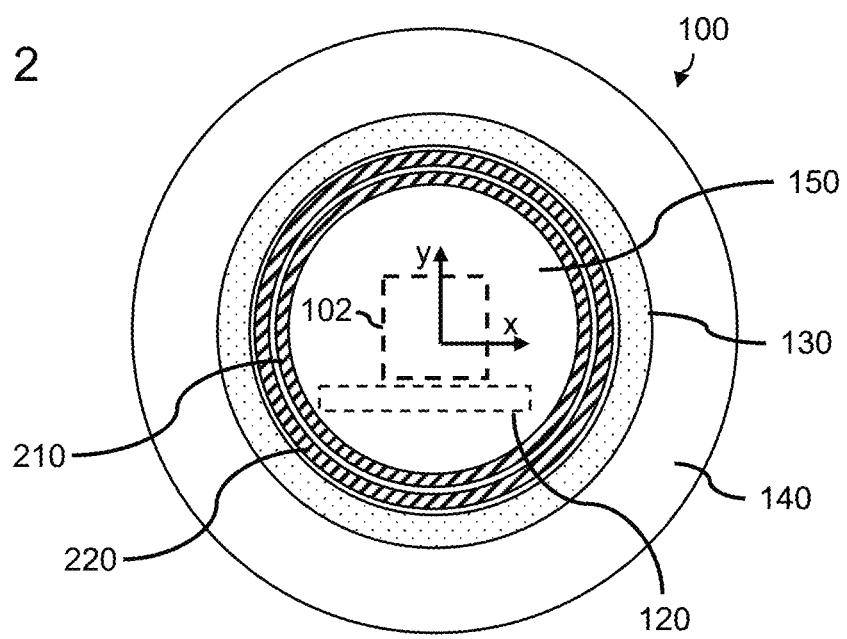
FIG. 2 is a schematic drawing showing a front-view cross-sectional representation of the magnetic resonance device and example gradient system of FIG. 1.

FIGS. 1 and 2 show a schematic representation of an example magnetic resonance (MR) device 100. FIG. 1 shows a top-down cross-sectional representation of the device 100 while FIG. 2 shows a front-view cross-sectional representation of the device 100. The MR device 100 is configured to acquire magnetic resonance data from a patient 50 occupying a scanning region 102 of the device 100. For clarity, the patient 50 is omitted from FIG. 2.

To allow the device 100 to obtain MR data, the patient 50 is situated on a patient table 120 and positioned such that at least a portion of the patient 50 is within the device 100, with the part of the patient which is to be scanned occupying the scanning region 102.

In the example shown in FIG. 1, the MR device 100 is a cylindrical MR device, sometimes referred to a closed MR device. That is, the device comprises a cylindrical bore 150 in which the patient 50 is situated for the scanning process. In other examples, an example MR device may have a different geometry. For example, another example MR device may have an open-bore geometry, an example of which will be described with reference to FIG. 8.

In the example of FIGS. 1 and 2, the cylindrical bore 150 is open at a front 110 of the device 100 to allow at the patient 50 to enter and exit the device 100. The patient table 120 may be movable, for example in a sliding translational motion along a z-axis (where x, y and z axes are shown in FIGS. 1 and 2), to allow the patient 50 to enter and exit the device 100.

The MR device 100 is configured to acquire magnetic resonance data from the scanning region 102. In this example, the scanning region 102 corresponds to a dedicated volume from which the device 100 is configured to acquire magnetic resonance signals. The MR device 100 may, for example, be configured to use the acquired magnetic resonance signals to generate an image of the part of the patient 50 which occupies the scanning region 102. Additionally, or alternatively, the MR device 100 may use the acquired signals to provide non-image information, such as diagnostic information.

The MR device 100 includes a magnetic field generator 130 configured to generate a main static magnetic field, referred to herein as the $B_0$ field, in the scanning region 102. The $B_0$ field inside the bore of the magnetic field generator 130 is dominated by a $B_z$ component oriented along the z-axis of the device 100. The $B_0$ field is typically substantially homogenous throughout the scanning region 102 and is used to the align the magnetic moments of the part of the patient 50 in the scanning region 102. The $B_0$ field, may for example, be a field having a magnetic field strength from around 1.5 T to around 3 T. The magnetic field generator 130 may, for example, be a superconducting electromagnet. In the example of FIG. 1, where the device 100 has a cylindrical geometry, the magnetic field generator 130 is a solenoid which surrounds the cylindrical bore 150 of the device 100.

The MR device 100 also includes a gradient system 200. The gradient system 200 is configured to generate a magnetic gradient field in the scanning region 102. In this example, the gradient system 200 comprises a first magnetic assembly 210, a second magnetic assembly 220, and a positioning unit 230 configured to adjust a position and/or orientation of the magnetic assemblies 210, 220 and/or of one or more components of the magnetic assemblies 210, 220. In this example, the gradient system 200 also comprises a control unit 240 configured to control the positioning unit 230 by providing commands to the positioning unit 230. The control unit 240 may be configured to control the positioning unit 230 to cause the magnetic gradient field generated by the gradient system 200 to be varied based on a scanning protocol for the device 100.

The first and second magnetic assemblies 210, 220 are each configured to generate a respective contribution to the magnetic gradient field in the scanning region 102. Each of the magnetic assemblies 210, 220 comprises one or more components configured to act as respective non-electric magnets to generate their respective contributions to the magnetic gradient field. For example, each of the magnetic assemblies 210, 220 may comprise ferromagnetic material configured to be magnetized in use by the magnetic resonance device 100, for example, by the $B_0$ field. Alternatively, or additionally, each of the magnetic assemblies 210, 220 may comprise permanent magnetic material. In use, each of the magnetic assemblies 210, 220 is polarized along the z-axis to produce a field along the z direction which is superimposed on the $B_0$ field. In the case where the magnetic assemblies 210, 220 comprise ferromagnetic material, the ferromagnetic material may be polarized in use by the $B_0$ field. Where the magnetic assemblies 210, 220 comprise permanent magnetic material, the permanent magnetic material may be arranged such that it is polarized along the z-axis.

Although the direction of the magnetic gradient field is oriented along the z-axis, a gradient of the magnetic gradient field may be oriented in any direction. That is, the strength of the magnetic gradient field along the z-axis may vary with position within the scanning region 102 in one or more of the x, y and z directions. For example, each of the magnetic assemblies 210, 220 may be configured to generate a field contribution having a gradient in the xy-plane. Each of these gradients may be substantially linear.

In this example, each of the magnetic assemblies 210, 220 is a substantially tubular assembly arranged coaxially with the magnetic field generator 130. The first magnetic assembly 210 is located inside of the second magnetic assembly 220 and both magnetic assemblies 210, 220 are located inside of the magnetic field generator 130.

Each of the magnetic assemblies 210, 220 may be configured to generate their respective contributions to the magnetic gradient field by virtue of comprising a particular distribution of magnetic material. For example, each magnetic assembly 210, 220 may include magnetic material arranged such that its distribution about the z-axis varies along the z-axis. In this example, as mentioned above, the magnetic assemblies 210, 220 are each substantially tubular, and the respective magnetic material of the magnetic assemblies 210, 220 is arranged on the surface of a cylinder. For example, the magnetic material may be arranged such that there is magnetic material at some parts on the surface of the cylinder while there is no magnetic material at other parts of the surface of the cylinder. Examples of such an arrangement are described below with reference to FIGS. 3 to 6.

In other examples, each of the magnetic assemblies 210, 220 may comprise magnetic material which varies in other ways at different positions to produce the contributions to the magnetic gradient field. For example, in addition to or alternatively to the above-mentioned variations in the distribution of magnetic material, the thickness and/or magnetic susceptibility or magnetization of the material, or other properties of the material which may affect the strength of the magnetic field generated, may vary with position.

The positioning unit 220 is configured to control a position and/or orientation of the magnetic assemblies 210, 220 with respect to the scanning region in order to adjust the magnetic gradient field. For example, the positioning unit 220 may be configured to rotate each of the magnetic assemblies 210, 220 about the z-axis, to adjust their respective contributions to the magnetic gradient field and thereby to adjust the magnetic gradient field.

Figure 4:
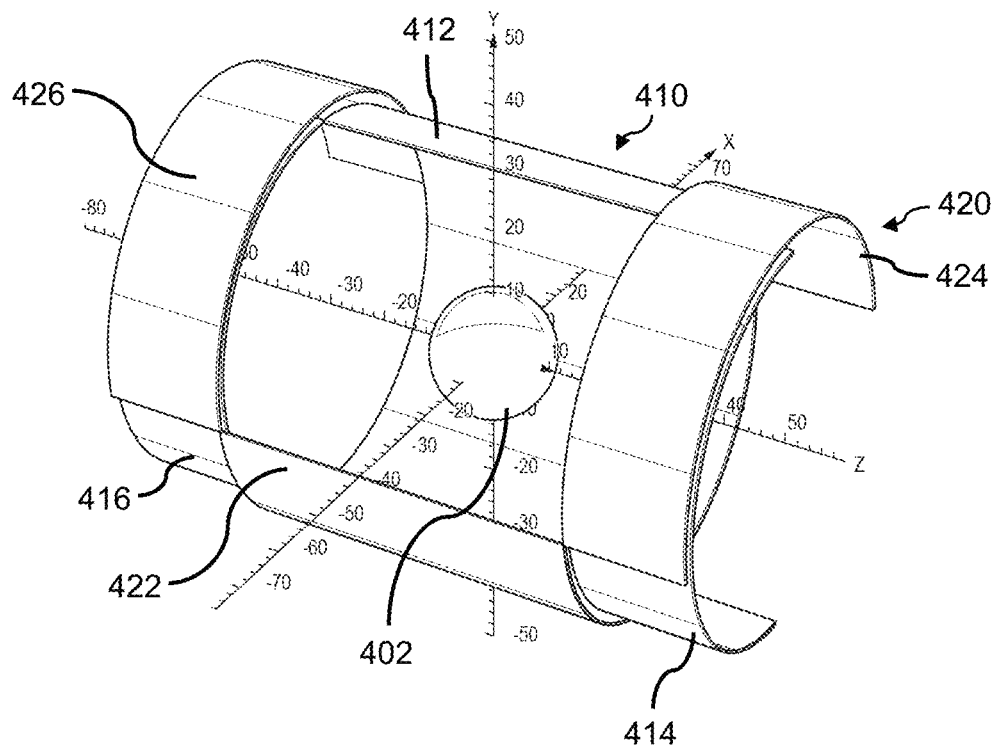
FIG. 4 is a schematic drawing showing a perspective view of an example arrangement of two magnetic assemblies of an example gradient system.
Figure 5:
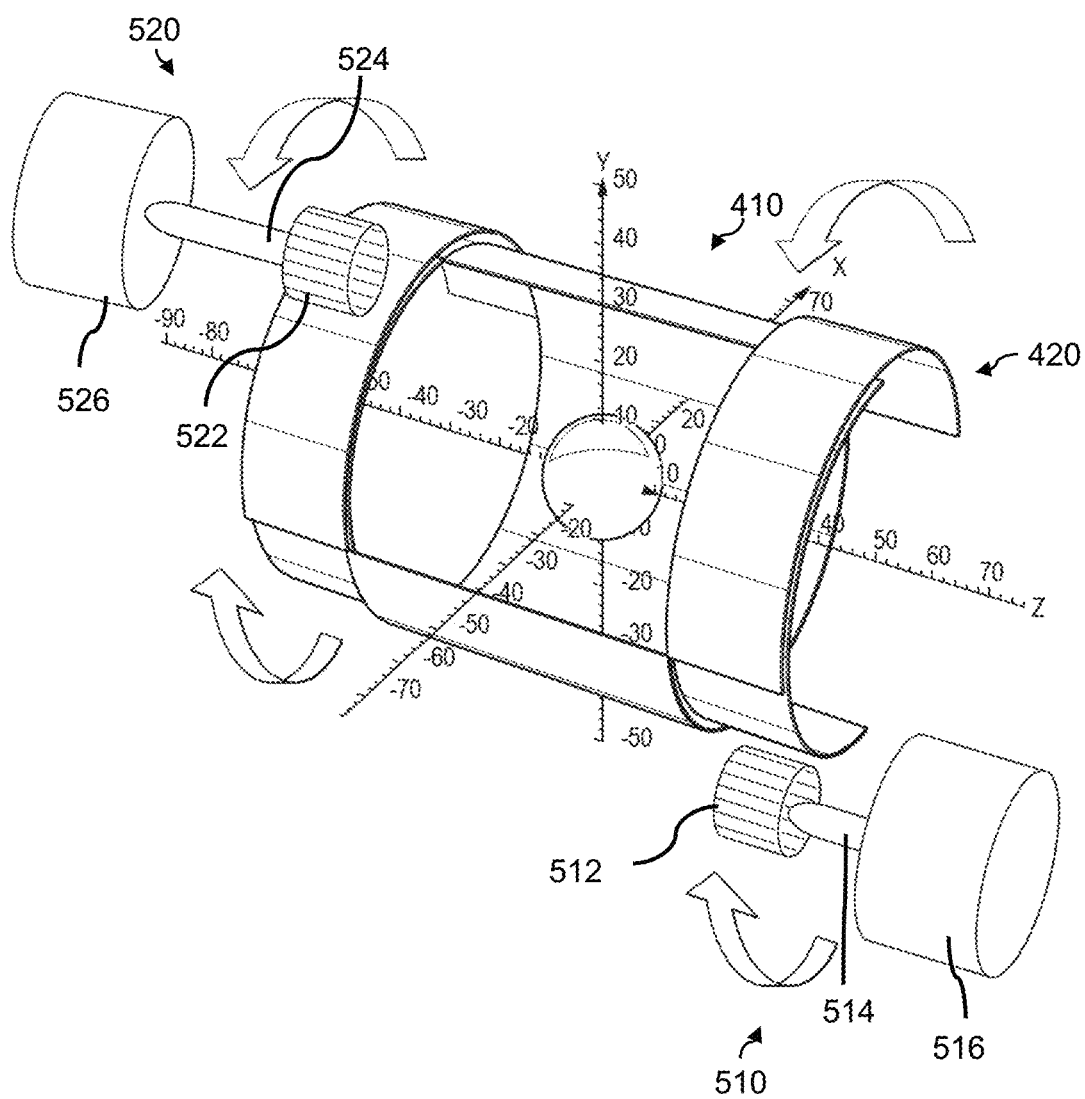
FIG. 5 is a schematic drawing showing a perspective view of the arrangement of FIG. 4 with example positioning components for adjusting respective orientations of the magnetic assemblies of the arrangement.

For example, in a particular orientation, the first magnetic assembly 210 may be configured to provide a gradient of $B_z$ along the x-axis. That is, the magnetic gradient field has a direction along the z-axis but the magnetic field strength in the z direction increases with increasing x. By rotating the magnetic assembly 210 by 90 degrees, the gradient may be adjusted to be oriented along the y-axis. Similarly, the second magnetic assembly 220 may be configured to generate a gradient in the x direction when in a particular orientation with the direction of the gradient being adjustable by rotating the second magnetic assembly 220 about the z-axis. The positioning unit 220 may be configured to allow the magnetic assemblies 210, 220 to be rotated by any arbitrary angle about the z-axis to provide for the gradient of the magnetic gradient field to be oriented at any angle in the xy-plane. For example, the first and second magnetic assemblies 210, 220 may be rotatable with respect to one another to vary the strength of the gradient of the magnetic gradient field and rotatable with respect to the scanning region 102 to vary the orientation of the gradient of the magnetic gradient field. An example of such an arrangement is shown in FIGS. 4 and 5 and will be described in more detail below.

In other examples, the gradient system 200 may be configured to provide a non-zero gradient in the z direction. For example, a thickness or magnetic susceptibility of magnetic material forming one or more of the magnetic assemblies 210, 220 may vary along the z-axis, providing a variation in the $B_z$ component of the magnetic gradient field along the z-axis.

While in the example shown in FIGS. 1 and 2, the gradient system 200 comprises two magnetic assemblies 210, 220, in other examples, a gradient system may comprise only one magnetic assembly. For example, the second magnetic assembly 220 may be absent. In such examples, the magnetic gradient field may comprise only the first magnetic gradient field contribution, which is generated by the first magnetic assembly 210. In some such examples, the magnitude of the gradient produced by the gradient system may be fixed, with an orientation of the gradient being variable by rotation of the magnetic assembly 210. In other such examples, the magnetic assembly may comprise components which are movable with respect to one another to allow the contribution to the magnetic gradient field to be adjusted to allow both a magnitude and orientation of the gradient to be varied. Examples of such arrangements will be described in more detail below.

As described above, the gradient provided by the magnetic gradient field may be used for localization of magnetic resonance signals from protons in the scanning region 102 to allow magnetic resonance images or other magnetic resonance data to be generated. That is, since the magnitude of the $B_z$ component varies across the scanning region 102 when a gradient is generated, a known variation in the resonance frequency of protons as a function of position in the scanning region 102 is provided. By varying the magnetic gradient field with time, the relationship between resonance frequency and position can be manipulated to obtain magnetic resonance data which may be used to generate an image and/or other information, such as diffusion coefficients. The magnetic gradient field may be varied according to a scanning protocol and the control unit 240 may be configured to control the positioning unit 220 to adjust the orientation of the magnetic assembly 210 to vary the magnetic gradient field as required according to the scanning protocol.

FIG. 1 is a simplified representation of the device 100. It is to be understood that the magnetic resonance device 100 may comprise further components, for example, a high frequency system for emitting high frequency electromagnetic radiation into the scanning region and/or receiving magnetic resonance signals from the scanning region, a cooling system for the magnetic field generator 130, shielding, power control components and the like.

Figure 3:
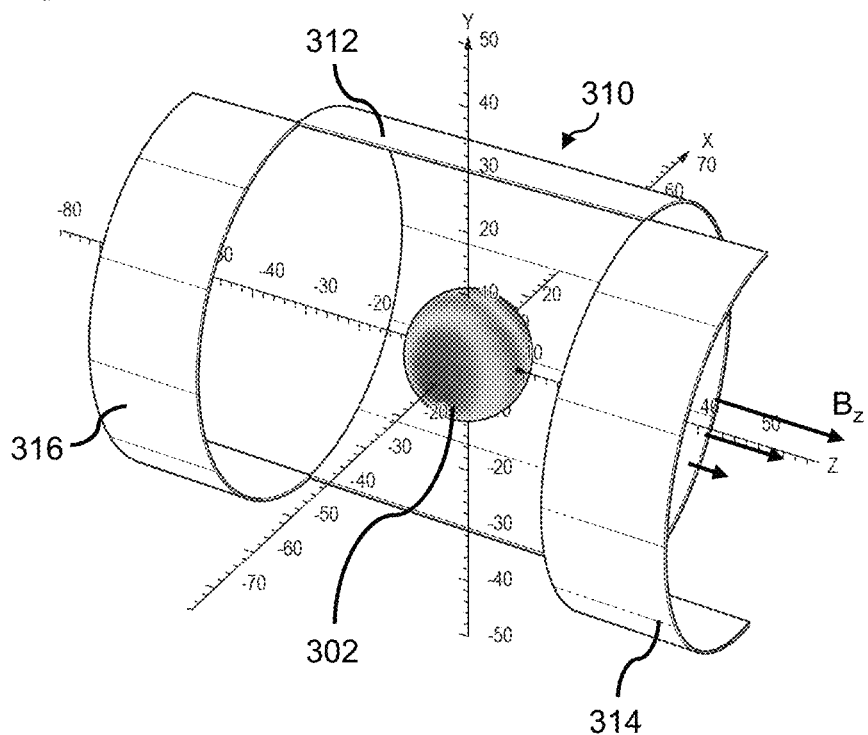
FIG. 3 is a schematic drawing showing a perspective view of an example of an example magnetic assembly of an example gradient system.

FIG. 3 shows an example of a magnetic assembly 310 of a gradient system. The magnetic assembly 310 may, for example, be used as part of a gradient system of a magnetic resonance device such as the gradient system 200 of FIGS. 1 and 2.

FIG. 3 shows an example of how the desired gradient component is generated by the shape of the assembly. The magnetic assembly 310 is elongate and is a substantially tubular assembly. The magnetic assembly 310 shown in FIG. 3 is an example of an assembly configured to generate a magnetic gradient field contribution having a gradient which is oriented in a transverse direction with respect to a longitudinal axis of the assembly 310. In particular, the assembly 310 is configured to generate a magnetic gradient field contribution having a significant gradient in the xy-plane while reducing the most significant contaminant harmonic (Z2).

The magnetic assembly 310 may comprise ferromagnetic material which is configured to be magnetized in use by an external magnetic field, such as by the $B_0$ field of a magnetic resonance device, in the manner described by way of example with reference to FIGS. 1 and 2. For example, the magnetic assembly 310 may be formed of a sheet of iron or steel, such as carbon steel. In other examples, the magnetic assembly 310 may be formed of permanent magnet material such that it is magnetized even in the absence of an external magnetic field. Other arrangements may include a combination of permanently magnetized material along with ferromagnetic material to provide for variable polarization and therefore for generation of a gradient with a variable magnitude and direction.

In this example, the material of the magnetic assembly 310 is arranged on the surface of a cylinder, as described in the example of FIGS. 1 and 2. The magnetic assembly 310 in this simplified example comprises three components: a center component 312, a first end component 314 located at a first longitudinal end of the center component 312, and a second end component 316 located at a second longitudinal end of the center component 312. The first end component 314 is located towards a positive z position while the second end component 316 is located towards a negative z position.

A part of a scanning region 302 is represented in FIG. 3 as a sphere at a center of which is located an origin of the coordinate axes x, y, z. Arrows in FIG. 3 indicate the variation in magnitude of the $B_z$ component of the magnetic gradient field contribution generated by the magnetic assembly 310. When aligned as shown in FIG. 3, the magnetic assembly 310 generates a gradient in the positive x-direction. If rotated by 90 degrees around the z-axis in a clockwise manner, it would generate a gradient in the y direction.

In this example, each of the components 312, 314, 316 is substantially C-shaped and has a semi-circular cross-section along the z-axis. In FIG. 3, the magnetic assembly 310 is oriented such that the cross-sections of each of the components 312, 314, 316 extend between the positive y-axis and the negative y-axis. The center component 312 is situated to the positive x direction while the first and second end components 314, 316 are each situated to the negative x direction. Accordingly, when viewed along the z-axis, the components 312, 314, 316 form a substantially continuous ring of magnetic material about the z-axis. The center component 312 is longer in the z-direction than the end components 314, 316.

If the center component 312 were of infinite length, then it would produce a field having a linear gradient in the x-direction. However, the finite length of the center component 312 may result in edge effects affecting the linearity of the field gradient. The inclusion of the end components 314, 316 may contribute to reducing such non-linearities in the gradient in the scanning region 302.

Figure 6:
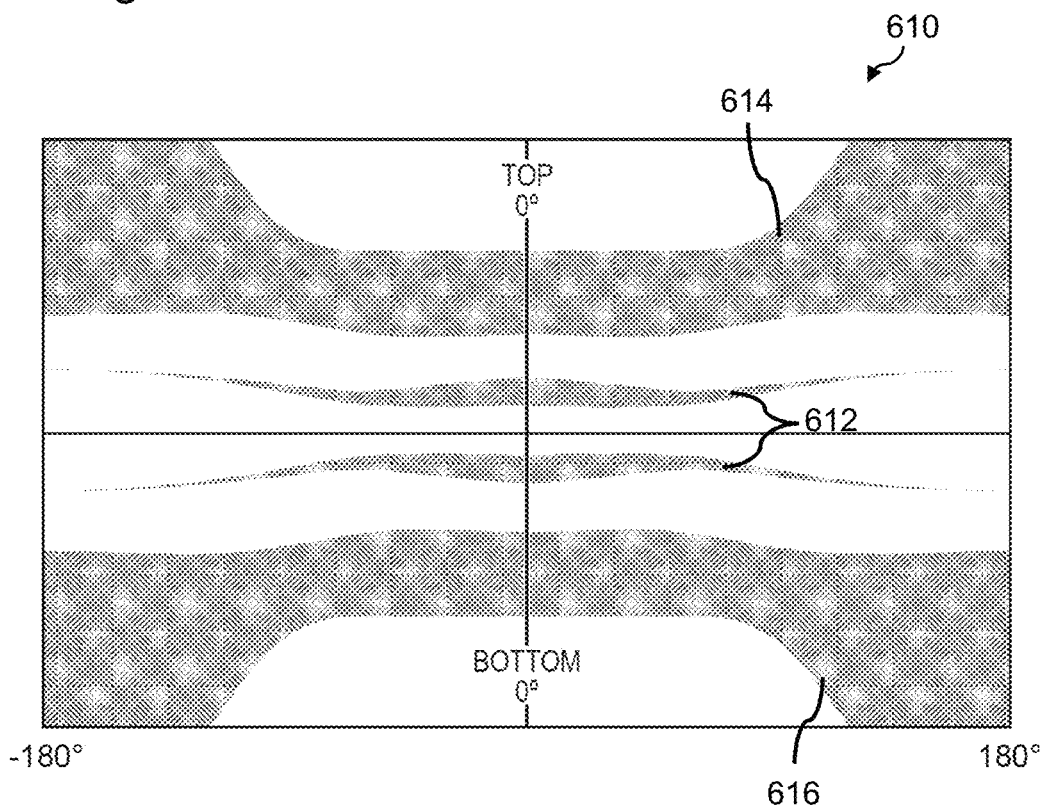
FIG. 6 is a schematic drawing showing a 2D representation of an example magnetic assembly.

In other examples, a magnetic assembly may be configured to allow a more linear gradient to be produced having lower magnitude contaminant harmonics. FIG. 6, which will be described below, shows an example of such an assembly.

The magnetic assembly 310 of FIG. 3 may be used in a gradient system either alone or in combination with one or more further magnetic assemblies. If used alone, the magnetic assembly 310 may provide a magnetic gradient field having a gradient of fixed magnitude whose orientation may be varied by rotation of the magnetic assembly 310 about the z-axis.

FIG. 4 shows an example arrangement including two magnetic assemblies 410, 420. As with FIG. 3, the magnetic assemblies 410, 420 may, for example, be used as part of a gradient system of a magnetic resonance device such as the gradient system 200 of FIGS. 1 and 2.

In this example, the arrangement includes a first magnetic assembly 410 and a second magnetic assembly 420. The first magnetic assembly 410 and the second magnetic assembly 420 may each have any of the features of the first magnetic assembly 310 of FIG. 3. The magnetic assemblies 410, 420 of FIG. 4 are arranged coaxially with one another with respect to the z-axis. The second assembly 420 is the outer of the two assemblies and therefore has a slightly larger radius than the first assembly 410. Similarly to the magnetic assembly 310 described with reference to FIG. 3, the first assembly 410 comprises a center component 412, a first end component 414 and a second end component 416. The second assembly 420 also comprises a center component 422, a first end component 424 and a second end component 426.

The first magnetic assembly 410 generates a first contribution to the magnetic gradient field in the scanning region 402 while the second magnetic assembly 420 generates a second contribution to the magnetic gradient field in the scanning region 402. In the manner described with reference to the assembly 310 of FIG. 3, the gradient field contributions generated by the first and second magnetic assemblies 410, 420 are each transverse to the z-axis and lie in the xy-plane.

The magnetic assemblies 410, 420 are arranged to be independently rotatable about the z-axis such that their orientation with respect to one another and their respective orientations with respect to the scanning region 402 can be adjusted. This allows for the orientations of the first and second contributions to the magnetic gradient field to be independently adjusted and therefore for the magnetic gradient field to be adjusted.

Specifically, relative rotation of the two assemblies can then either constructively or destructively vary the $dB_z$ field gradient in the xy-plane. Relative rotational movement of the two assemblies may allow the total field gradient at any given angle to be adjusted from a maximum value of substantially twice the value generated by the individual assemblies 410, 420 by aligning both assemblies in the same orientation, through zero by aligning the two assemblies in opposite directions to each other. A minimum field gradient of minus substantially twice the value generated by each individual assembly can be generated by aligning both of the assemblies in an opposite orientation to the original orientation. For example, in the example shown in FIG. 4, the second magnetic assembly 420 is rotated by 80 degrees with respect to the first magnetic assembly 410. The gradient created is therefore rotated by 40 degrees with respect to that produced by the single assembly 310 in the example of FIG. 3.

In this way any value of gradient strength from substantially zero to the maximum value and any direction of $dB_z$ in the xy-plane can be achieved by rotating the two assemblies 410, 420 with respect to each other. This allows switching on and off of the gradient and adjusting the strength of the gradient.

Using such a gradient system, applying a non-zero gradient strength for extended periods of time may have reduced thermal penalty as the one or more assemblies for generating the magnetic gradient field may require no electrical energy to create the field. Components made of high ferromagnetic materials or permanent magnets generally have relatively low electrical conductivities, so eddy current generation within the one or more assemblies may be low. Moreover, if the assembly or assemblies are located in regions of high magnetic field homogeneity, then a change in orientation of one or more of the assemblies may have a low associated torque requirement. This may allow for relatively high rotational speeds to be achieved and for fast adjustment of the gradient field to be achieved.

An example gradient system may have no requirement for high-power gradient amplifiers, since no electrical drive currents may be required to create the field gradients. Furthermore, the generation of the gradient field may mitigate or avoid the thermal effects due to rapidly switched currents in conventional systems. The gradient system may not require liquid cooling. For these reasons, certain examples may provide a lower cost method of creating variable gradient strengths.

Certain examples may be particularly suitable for low-cost magnetic resonance systems where lower field gradient strengths are acceptable and where the cost of a conventional gradient subsystem becomes a significant part of the magnetic resonance system cost.

Moreover, the rapid change of gradient in an example gradient system may generate a lower level of acoustic noise than in a conventional gradient system because, unlike in a conventional gradient system comprising gradient coils which may generate significant acoustic noise due to coil conductor vibrations, an example gradient system may have no conventional gradient coils.

FIG. 5 shows an example of the assemblies 410, 420 of FIG. 4 along with rotating units 510, 520 of a positioning unit for controlling rotation of the assemblies 410, 420. A first rotating unit 510 is configured to rotate the first assembly 410 while a second rotating unit 520 is configured to rotate the second assembly 420. The first rotating unit comprises a drive member 516 coupled to an engaging member 512 by a shaft 514. The engaging member 512 is configured to engage an outer surface of the first assembly 410 to control rotation of the first assembly 410. For example, the engaging member 512 may comprise a high-friction material configured to engage the outer surface of the first assembly 410 or, alternatively, the engaging member 512 may be a gear configured to engage with teeth (not shown) on an outer surface of the first assembly 410. The second rotating unit 520 is configured to control rotation of the second assembly 420 and comprises, similarly to the first rotating unit 510, a drive member 526, an engaging member 522, and a shaft 524.

The positioning unit comprising the rotating units 510, 520 may also comprise components (not shown) for driving the rotating units 510, 520, for example, an electric motor or hydraulic motor for driving the rotating units. As described above, the positioning unit may be controlled by a control unit, for example, in dependence on a sequence protocol of the magnetic resonance device to vary the gradient of the magnetic gradient field produced by the assemblies 410, 420.

A ramp time for varying the gradient of the magnetic gradient field produced by the assemblies 410, 420 may be governed by a speed at which the two assemblies 410, 420 can be rotated. Moreover, eddy current compensation can be achieved by applying a modification to the relative rotational angles at the end of the gradient ramps. For example, when rotating the assemblies 410, 420 with respect to one another to reduce the gradient from a non-zero value to zero, the assemblies 410, 420 may initially be over rotated by a small angle to compensate for eddy currents which may be generated by the rotation of the assemblies 410, 420.

FIG. 6 shows an example of another magnetic assembly 610. The representation of FIG. 6 shows a representation of the magnetic assembly 610 unwrapped from a cylinder onto a 2D plane surface. The magnetic assembly 610 is a refinement of an assembly of the type shown in FIG. 3 intended to produce a more linear gradient in the xy-plane with lower contaminant harmonics. The material has a polarisation in the direction from bottom to top. The shaded parts of the figure represent magnetic material, for example, ferromagnetic or permanent magnet material, while the white parts represent parts of the cylinder where there is no magnetic material. The magnetic assembly 610 comprises two central components 612, a first end component 614 towards the positive z direction and a second end component towards the negative z direction. In some examples, the magnetic field strength of the magnetic gradient field contribution generated by the assembly in use can be increased by increasing the material thickness perpendicular to the plane, or, for example, by increasing the magnetic susceptibility or, in the case of a permanent magnetic material, the magnetization of the magnetic material.

Figure 7:
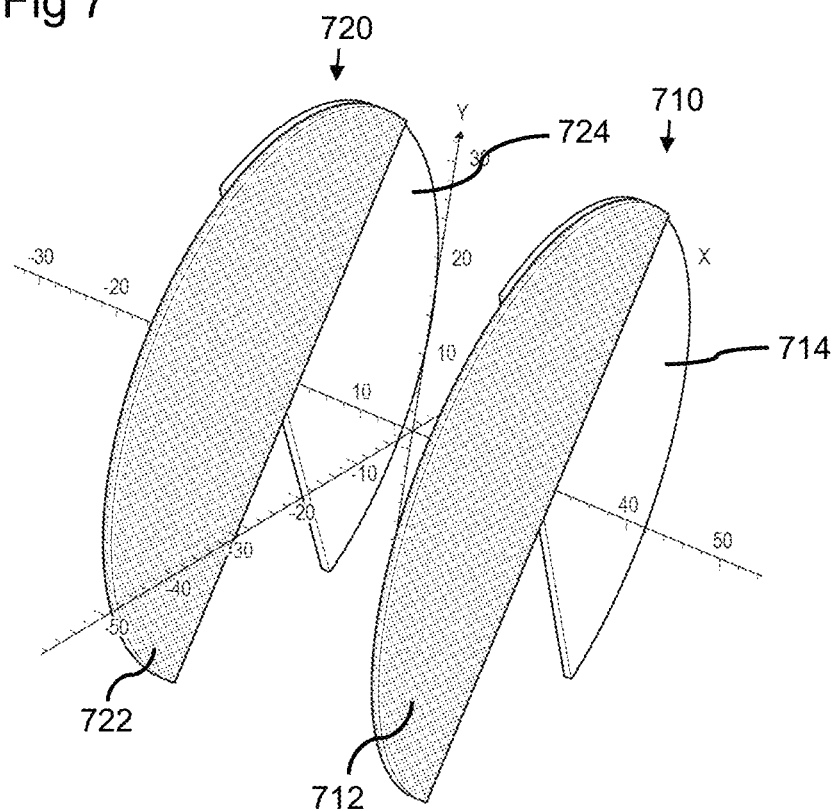
FIG. 7 is a schematic drawing showing a perspective view of another example arrangement of two magnetic assemblies of an example gradient system.

FIG. 7 shows another example arrangement of magnetic assemblies 710, 720 for generating a magnetic gradient field in a magnetic resonance device. The arrangement of FIG. 7 is configured to form part of a gradient system for generating a magnetic gradient field along a z-axis in a magnetic resonance device. As shown in FIG. 7, in use, the magnetic assemblies 710 are located along the z-axis. Each of the magnetic assemblies 710, 720 is substantially disc-shaped and is oriented in the xy-plane.

A first magnetic assembly 710 of the magnetic assemblies comprises a first segment 712 and a second segment 714. The first segment 712 and the second segment 714 each forming a segment of a disc and each having a semi-circular cross-section. The first segment 712 and the second segment 714 are rotatable about the z-axis and are arranged with respect to one another to allow a degree of overlap between the first segment 712 and the second segment 714 to be adjusted by rotation of one or the other of the segments 712, 714 about the z-axis.

Similarly, a second magnetic assembly 720 of the magnetic assemblies comprises a first segment 722 and a second segment 724 which form segments of a disc are which are rotatable with respect to one another to allow a degree of overlap between the first segment 722 and the second segment 724 to be adjusted.

The first and second assemblies 710, 720, in use, are polarized along the z direction and are configured to provide respective first and second magnetic gradient field contributions to a magnetic gradient field in a scanning region between the assemblies 710, 720. The assemblies 710, 720 may comprise any material configured to act as a non-electric magnet when in use in a magnetic resonance device in a similar manner as described above for earlier examples. For example, the assemblies may each comprise ferromagnetic material and/or permanent magnet material.

The magnetic gradient field contributions generated by the assemblies 710, 720 are adjustable by adjusting the degree of overlap between the first segments 712, 722 and the second segments 714, 724. For example, in the arrangement shown in FIG. 7, the assemblies 710, 720 are configured to generate a magnetic gradient field having a gradient oriented in the positive y direction. That is, the $B_z$ component of the magnetic gradient field increases with increasing y.

If the assemblies 710, 720 were rotated by 90 degrees in a counter-clockwise direction, while keeping the first segments 712, 722 and second segments 714, 724 in the same relative orientation with the same degree of overlap, then they would generate a magnetic gradient field having a gradient oriented along the positive x direction.

By adjusting the relative orientation and the relative degree of overlap of the first segments 712, 722 and the second segments 714, 724, the strength of the gradient generated can also be varied. For example, if the first segments 712, 722 and the second segments 714, 724 were adjusted to completely overlap one another, such that each of the assemblies 710, 720 had a semi-circular cross-section, a maximum gradient would be generated. Conversely, if the first segments 712, 722 and the second segments 714, 724 were adjusted such that there is no overlap between them, such that each of the assemblies 710, 720 had a circular cross-section, substantially no gradient would be generated.

In examples, the first segments 712, 722 may be configured to rotate synchronously with one another and the second segmented 714, 724 may be configured to rotate synchronously with one another. This allows for a gradient to be produced in any direction in the xy-plane and for the strength of the gradient to be adjusted as described above. The gradient produced may be substantially linear.

In other examples, the first segments 712, 722 may be rotated independently of one another and/or the second segments 714, 724 may be rotated independently of one another. This may allow for a non-linear gradient to be generated.

Figure 8:
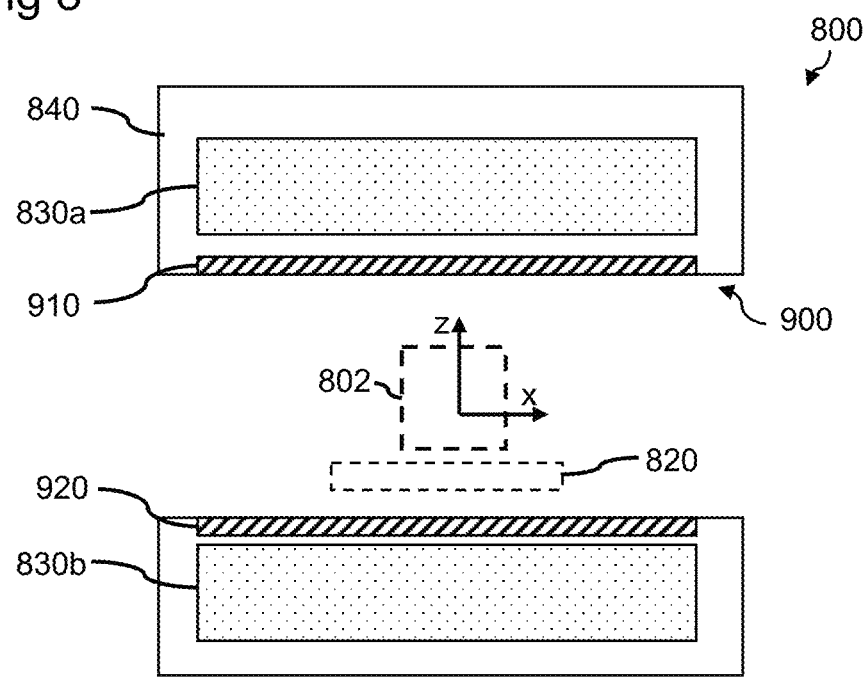
FIG. 8 is a schematic drawing showing a front-view cross-sectional representation of another example magnetic resonance device comprising an example gradient system.

FIG. 8 shows a schematic representation of an example magnetic resonance device 800 comprising a gradient system 900 in which an arrangement such as that shown in FIG. 7 may be used in a gradient system 900.

The device 800 may have any of the features described above for the example magnetic resonance device 100 of FIGS. 1 and 2. However, rather than having a cylindrical configuration, the magnetic resonance device 800 of FIG. 8 has an open-bore configuration. FIG. 8 shows a front-view cross-sectional representation of the device 800.

The device 800 includes a magnetic field generator 830a, 830b in a housing 840 and a patient table 820 configured to allow a patient (not shown) to be positioned such that a part of the patient of interest for scanning occupies a scanning region 802.

The magnetic field generator 830a, 830b, rather than being a solenoid as in a cylindrical configuration MR device, such as the MR device 100 of FIGS. 1 and 2, comprises two flat magnets 830a, 830b. The flat magnets 830a, 830b are arranged to generate a main magnetic field, that is, $B_0$ field, along a z direction. A yoke (not shown) may connect the flat magnets 830a, 830b.

In the example device 800, the gradient system 900 comprises a first magnetic assembly 910 and a second magnetic assembly 920 which are arranged between the flat magnets 830a, 830b and, like the magnets 830a, 830b, are aligned parallel to the z-axis. The first and second assemblies 910, 920 may have any of the features of the first and second assemblies 710, 720 described above with reference to FIG. 7 and are used to generate a magnetic gradient field in the scanning region 802.

In the manner described above, a positioning unit (not shown) of the device 800 is configured to adjust the magnetic gradient field by adjusting an orientation of the components of the assemblies 910, 920. A control unit (not shown) may control the positioning unit to adjust the magnetic gradient field based on a scanning protocol of the device 800.

Although certain examples described above include two magnetic assemblies, in other examples the gradient system may include different numbers of magnetic assemblies. For example, the gradient system may include only one magnetic assembly. In such an example, components of the single magnetic assembly may be movable with respect to one another, for example, to vary an orientation and/or strength of the gradient generated. In another such example, a single magnetic assembly may be used which generates a fixed magnitude of gradient and a position and/or orientation of the single magnetic assembly may be adjustable to vary its contribution to the magnetic gradient field in the scanning region. In yet other examples, the gradient system may include more than two magnetic assemblies which are configured to provide respective contributions to the magnetic gradient field in the scanning region.

Although in certain examples described above, examples of the gradient system are described which are configured to generate a gradient in the xy-plane, in other examples, the gradient system may be configured to generate a gradient having a z component. For example, the distribution or magnetization of material along the z-axis may vary such that a magnetic field strength of the magnetic gradient field varies along the z-axis. For example, the magnetic suscep-tibility of material may increase along the z-axis to result in an increase in the z component of the magnetic gradient field along the z-axis.

Moreover, in certain examples, the positioning unit is configured to adjust the magnetic gradient field by rotating of one or more magnetic assemblies or components thereof about the z-axis of the device. However, in other examples, the positioning unit may be configured to adjust the magnetic gradient field by other types of movement, such as translational movement, of one or more of the magnetic assemblies and/or the components thereof.

Certain examples above relate to a gradient system for a magnetic resonance device which is used to generate a variable magnetic gradient field in a scanning region. Example arrangements herein may additionally or alternatively be used to correct for inhomogeneities in the main magnetic field in a magnetic resonance device. In other words, the gradient produced by any of the example arrangements described herein may be used to shim the magnetic field in a magnetic resonance device. For example, inhomogeneities in the main magnetic field may be measured or otherwise determined, for example, analytically. An arrangement described herein may then be used to generate a magnetic gradient field having a gradient which is configured to correct for the determined inhomogeneity in the main magnetic field. A system for performing this shimming function may have any of the features described above with reference to example gradient systems.

Independent of the grammatical term usage, individuals with male, female or other gender identities are included within the term.

The above aspects are to be understood as illustrative examples of the invention. Other aspects are envisaged. It is to be understood that any feature described in relation to any one embodiment may be used alone, or in combination with other features described, and may also be used in combination with one or more features of any other of the aspects, or any combination of any other of the aspects. Furthermore, equivalents and modifications not described above may also be employed without departing from the scope of the invention, which is defined in the accompanying claims.

We claim:

1. A gradient system for a magnetic resonance device, the gradient system being configured to, when arranged in use in the magnetic resonance device, generate a variable magnetic gradient field in a scanning region of the magnetic resonance device, the gradient system comprising:
   a first magnetic assembly configured to generate a first magnetic gradient field contribution to the magnetic gradient field in the scanning region;
   wherein the first magnetic assembly comprises one or more components configured to, in use, act as respective non-electric magnets to generate the first magnetic gradient field contribution; and
   a positioning unit configured to adjust a position and/or orientation, relative to the magnetic resonance device, of the first magnetic assembly and/or of one or more of the one or more components of the first magnetic assembly to adjust the first magnetic gradient field contribution and thereby to vary the magnetic gradient field in the scanning region,
   wherein the first magnetic assembly is a first elongate magnetic assembly configured to provide the first magnetic gradient field contribution such that the first magnetic gradient field contribution has a gradient in plane transverse to a longitudinal axis of the first magnetic assembly, wherein the first elongate magnetic assembly is substantially tubular, and
wherein the one or more components of the first elongate magnetic assembly comprise one or more substantially C-shaped components.

2. The gradient system of claim 1, wherein the one or more components of the first magnetic assembly comprise one or more ferromagnetic components configured to be magnetized, in use, by a magnetic field generator of the magnetic resonance device to generate the first magnetic gradient field contribution.

3. The gradient system of claim 1, wherein the one or more components of the first magnetic assembly comprise one or more permanent magnets configured to generate the first magnetic gradient field contribution.

4. The gradient system of claim 1, comprising:
a control unit configured to control the positioning unit to vary the magnetic gradient field in dependence on a sequence protocol for acquiring magnetic resonance data from an object positioned within the scanning region.

5. The gradient system of claim 1, comprising:
a second magnetic assembly configured to provide a second magnetic gradient field contribution to the magnetic gradient field,
wherein the second magnetic assembly comprises one or more components configured to, in use, act as respective non-electric magnets to generate the second magnetic gradient field contribution.

6. The gradient system of claim 5, wherein the positioning unit is configured to adjust the variable magnetic gradient field by adjusting a position and/or orientation of the second magnetic assembly to adjust the second magnetic gradient field and thereby to vary the magnetic gradient field.

7. The gradient system of claim 6, wherein the positioning unit is configured to adjust a position and/or orientation of the first magnetic assembly and the second magnetic assembly with respect to one another to vary the magnetic gradient field.

8. The gradient system of claim 1, wherein the positioning unit is configured to variably rotate the first magnetic assembly with respect to the scanning region to adjust the first magnetic gradient field contribution and thereby to vary the magnetic gradient field.

9. The gradient system of claim 1, wherein the one or more substantially C-shaped components include two or more substantially C-shaped components which are oriented differently with respect to one another about the longitudinal axis of the first elongate magnetic assembly.

10. The gradient system of claim 9, wherein the two or more substantially C-shaped components comprise a central C-shaped component and two end C-shaped components situated at opposing longitudinal ends of the central C-shaped component.

11. The gradient system of claim 9, wherein the two or more substantially C-shaped components are arranged to form a substantially continuous ring of material about the longitudinal axis of the first elongate magnetic assembly when viewed along the longitudinal axis of the first elongate magnetic assembly.

12. The gradient system of claim 5,
wherein the positioning unit is configured to variably rotate the first magnetic assembly with respect to the scanning region to adjust the first magnetic gradient field contribution and thereby to vary the magnetic gradient field,
wherein the second magnetic assembly and the first magnetic assembly are each elongate, and
wherein the positioning unit is configured to variably rotate the first magnetic assembly and the second magnetic assembly with respect to one another about their respective longitudinal axes to adjust respective orientations of the first magnetic gradient field contribution and the second magnetic gradient field contribution and thereby to vary the magnetic gradient field.

13. The gradient system of claim 12, wherein the first magnetic assembly and the second magnetic assembly are each substantially tubular and are arranged to be longitudinally coaxial with one another.

14. The gradient system of claim 1, wherein the one or more components of the first magnetic assembly comprise two components and wherein the positioning unit is configured to variably adjust a position and/or orientation of the two components with respect to one another to adjust the first magnetic gradient field contribution.

15. The gradient system of claim 5,
wherein the one or more components of the first magnetic assembly comprise two components and wherein the positioning unit is configured to variably adjust a position and/or orientation of the two components with respect to one another to adjust the first magnetic gradient field contribution, and
wherein the one or more components of the second magnetic assembly comprise two components and wherein the positioning unit is configured to variably adjust a position and/or orientation of the two components with respect to one another to adjust the second magnetic gradient field contribution.

16. The gradient system of claim 15,
wherein the first magnetic assembly and the second magnetic assembly are each arranged along a longitudinal axis of the gradient system, and
wherein the positioning unit is configured to rotate the one or more components of the first magnetic assembly and the one or more components of the second magnetic assembly about the longitudinal axis to adjust the first magnetic gradient field contribution and the second magnetic gradient field contribution.

17. The gradient system of claim 16, wherein the positioning unit is configured to:
rotate, about the longitudinal axis of the gradient system, a first of the two components of the first magnetic assembly and a first of the two components of the second magnetic assembly such that their orientation with respect to one another about the longitudinal axis remains fixed; and
rotate, about the longitudinal axis of the gradient system, a second of the two components of the first magnetic assembly and a second of the two components of the second magnetic assembly such that their orientation with respect to one another about the longitudinal axis remains fixed.

18. A magnetic resonance device for acquiring magnetic resonance data from a scanning region, the magnetic resonance device comprising a gradient system according to claim 1.

19. A gradient system for a magnetic resonance device, the gradient system being configured to, when arranged in use in the magnetic resonance device, generate a variable magnetic gradient field in a scanning region of the magnetic resonance device, the gradient system comprising:

a first magnetic assembly configured to generate a first magnetic gradient field contribution to the magnetic gradient field in the scanning region, wherein the first magnetic assembly comprises one or more components configured to, in use, act as respective non-electric magnets to gene the first magnetic gradient field contribution; and positioning unit configured to adjust a position and/or orientation, relative to the magnetic resonance device, of the first magnetic assembly and/or of one or more of the one of more components of the first magnetic assembly to adjust the first magnetic gradient field contribution and thereby to vary the magnetic gradient field in the scanning region, wherein the one or more components of the first magnetic assembly comprise two components and wherein the unit is configured to variably adjust a position and/or orientation of the two components with respect to one another adjust the first magnetic gradient field contribution, wherein the first magnetic assembly is a substantially disc-shaped assembly and the two components of the first magnetic assembly are each segments of the substantially disc-shaped assembly, and wherein the positioning unit is configured to adjust a degree of overlap of the two components to adjust the first magnetic gradient field contribution.

\* \* \* \* \*